US 6,632,334 B2

(12) United States Patent
Anderson et al.

(10) Patent No.: US 6,632,334 B2
(45) Date of Patent: Oct. 14, 2003

(54) DISTRIBUTED POWER SUPPLIES FOR MICROELECTRONIC WORKPIECE PROCESSING TOOLS

(75) Inventors: Timothy A. Anderson, Kalispell, MT (US); Tim McGlenn, Kalispell, MT (US); Steve L. Eudy, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 135 days.

(21) Appl. No.: 09/875,304

(22) Filed: Jun. 5, 2001

(65) Prior Publication Data

US 2002/0179436 A1 Dec. 5, 2002

(51) Int. Cl.[7] .............................................. C25D 21/12
(52) U.S. Cl. ................ 204/227; 204/229.4; 204/230.2; 204/230.8
(58) Field of Search ........................... 204/229.4, 230.2, 204/230.8, 227

(56) References Cited

U.S. PATENT DOCUMENTS 6,428,673 B1 * 8/2002 Ritzdorf et al. ............... 205/84

* cited by examiner

Primary Examiner—Arun S. Phasge
(74) Attorney, Agent, or Firm—Perkins Coie LLP (57) ABSTRACT

An apparatus and method for processing microelectronic workpieces. The apparatus can include a housing at least partially enclosing a process environment, with a first processing chamber and a second processing chamber positioned within the housing. The first processing chamber can have a first electrically powered device, such as a first anode and/or a first cathode, and the second processing chamber can have a second electrically powered device, such as a second anode and/or a second cathode. A first power supply is electrically coupled to the first processing chamber to provide electrical power to at least one of a first anode and a first cathode, and a second power supply is electrically coupled to the second processing chamber to provide electrical power to at least one of the second anode and the second cathode. A first conductive link between the first power supply and the first processing chamber can be electrically decoupled from a second conductive link between the second power supply and the second processing chamber. The conductive links can have the same impedance, resistance, and/or length.

53 Claims, 4 Drawing Sheets

Fig. 4

DISTRIBUTED POWER SUPPLIES FOR MICROELECTRONIC WORKPIECE PROCESSING TOOLS

CROSS-REFERENCE TO RELATED APPLICATIONS

This application is related to the following:

(a) U.S. patent application Ser. No. 09/875,300, entitled "TRANSFER DEVICES FOR HANDLING MICROELECTRONIC WORKPIECES WITHIN AN ENVIRONMENT OF A PROCESSING MACHINE AND METHODS OF MANUFACTURING AND USING SUCH DEVICES IN THE PROCESSING OF MICROELECTRONIC WORKPIECES," filed concurrently, (b) U.S. patent application Ser. No. 09/875,428, entitled "INTEGRATED TOOLS WITH TRANSFER DEVICES FOR HANDLING MICROELECTRONIC WORKPIECES," filed concurrently, (c) U.S. patent application Ser. No. 09/872,151, entitled "APPARATUS AND METHODS FOR ELECTROCHEMICAL PROCESSING OF MICROELECTRONIC WORKPIECES," filed May 31, 2001, (d) U.S. patent application Ser. No. 09/875,365, entitled "ADAPTABLE ELECTROCHEMICAL PROCESSING CHAMBER," filed concurrently, (e) U.S. patent application Ser. No. 09/875,424, entitled "LIFT AND ROTATE ASSEMBLY FOR USE IN A WORKPIECE PROCESSING STATION AND A METHOD OF ATTACHING THE SAME," filed concurrently, (f) U.S. patent application Ser. No. 09/849,505, entitled "TUNING ELECTRODES USED IN A REACTOR FOR ELECTROCHEMICALLY PROCESSING A MICROELECTRONIC WORKPIECE," filed on May 4, 2001.

All of the foregoing U.S. Patent Applications in paragraphs (a)–(f) above are herein incorporated by reference.

TECHNICAL FIELD

The present invention is directed toward methods and apparatuses for distributing power in microelectronic workpiece processing tools.

BACKGROUND

Microelectronic workpieces, such as semiconductor wafers, typically undergo several processing steps within a single enclosed environment. For example, microelectronic workpieces can be plated, annealed, etched, and cleaned in a plurality of processing chambers that are located within a single housing or cabinet. These processes can be performed on each workpiece individually in separate single-wafer processing chambers, which is referred to in the industry as "single-wafer processing." The workpieces are thus typically transferred from one processing station to another within the housing.

Figure 1:
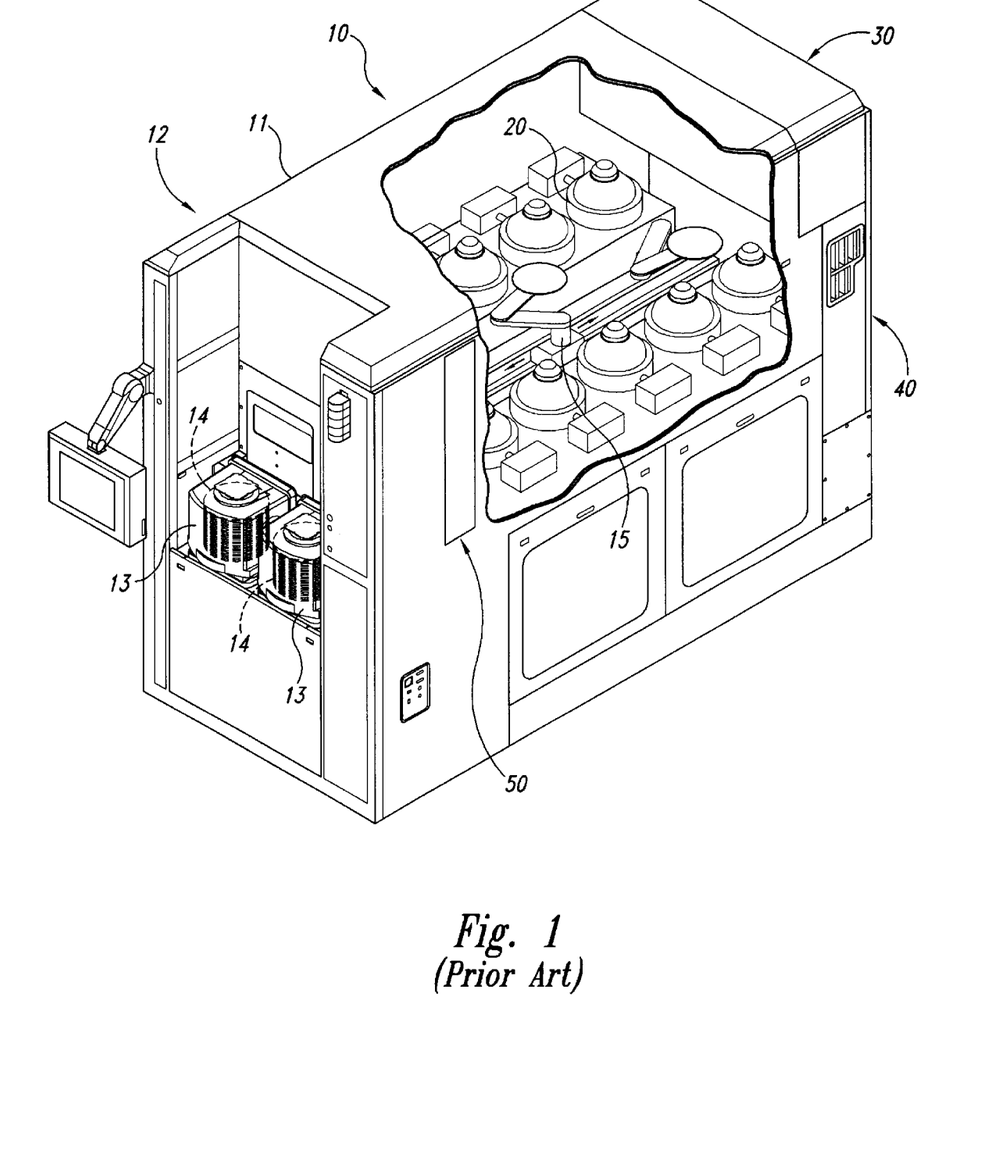
FIG. 1 is an isometric view of a device configured to process microelectronic workpieces in accordance with the prior art with a cut-away section to illustrate internal components.

FIG. 1 illustrates an apparatus 10 for single-wafer processing in accordance with one embodiment of an LT-210C available from Semitool, Inc. of Kalispell, Mont. The apparatus 10 includes a housing 11 that encloses a plurality of processing chambers 20 and a workpiece loader 12 that receives containers 13 filled with microelectronic workpieces 14. The apparatus 10 also includes a robot 15 that removes the workpieces 14 from the containers 13, moves the workpieces 14 among the processing chambers 20, and returns the processed workpieces 14 to the containers 13.

As shown in FIG. 1, the apparatus 10 includes a central power supply 30 that receives, for example, AC power and converts the AC power to other waveforms for use throughout the tool. For example, the output of the power supply 30 is provided to each of the electrodes in the plating chambers. Additional power supplies are generally used to operate solenoid valves 50 for directing fluid to and from the processing chambers 20, the workpiece loader 12 (to drive the motors and actuators that move and access the containers 13), and to two head controllers 40 (one of which is visible in FIG. 1). The head controllers 40 are coupled to the processing chambers 20 to drive the motors that open, close, and otherwise operate the chambers 20.

The power provided from the power supply 30 to the electrodes in the processing chambers and the power provided from other power sources to other components of the tool are conducted along a power distribution network that typically comprises a variety of cable types that have different electrical characteristics (i.e., physical construction, impedance, electromagnetic coupling, noise immunity, etc.). Although variation in the electrical characteristics of the cables may be tolerable for the power conducted to the motors used in processing chambers, even subtle variations between the electrical characteristics of the power provided to the electrodes in the electrochemical processing chambers can result in substantial differences and inconsistencies in the wafers.

One characteristic of some existing power distribution networks is that the power distribution lines used to provide power to electrodes in a first processing chamber may have different electrical characteristics than the power distribution lines that provide power to electrodes in a second electrochemical processing chamber. Further, the power distribution lines that provide power to the electrodes in the processing chambers may be electromagnetically coupled to other power distribution lines in the power distribution network in some applications. The signals transmitted to one processing chamber over one power line, for example, can be inductively and/or capacitively coupled with signals transmitted to other components. Many applications compensate for such inductive and/or capacitive coupling by shielding the power lines, but even shielding may not provide adequate protection in some instances. As a result, different processing chambers often effectively receive different chemical processing power signals.

SUMMARY

The present invention is directed toward methods and apparatuses for processing microelectronic workpieces. The present inventors have recognized that there is a need to provide each of the electrochemical processing chambers in a processing tool with at least substantially the same electrochemical processing power to ensure consistent processing performance between the various electrochemical processing chambers. Further, they have recognized that this can be accomplished by placing a number of power supplies at various locations in a processing tool to reduce the impact that the cables in the power distribution network have upon the effective signals received by the electrodes in the electrochemical processing stations. The present inventors accordingly developed various solutions to the foregoing problems that include, for example, locating a plurality of power supplies throughout a processing apparatus so that the electrical links or other types of power distribution lines between the power supplies and the processing chambers have at least substantially the same electrical characteristics and are not subject to extensive electromagnetic interference from other cables. Therefore, several embodiments of microelectronic processing tools in accordance with the invention provide at least substantially the same effective power to electrodes in electrochemical processing stations for enhancing the consistency in the plating performance of similar electrochemical processing stations.

In one aspect of the invention, the apparatus can include a housing at least partially enclosing a process environment. The housing can include a first processing chamber having a first anode and a first cathode, and a second processing chamber having a second anode and a second cathode. A first power supply can be electrically coupled to the first processing chamber to provide electrical power to at least one of the first anode and the first cathode, and a second power supply can be electrically coupled to the second processing chamber to provide electrical power to at least one of the second anode and the second cathode.

In several embodiments, the first power supply can be dedicated to provide power to the first anode and the first cathode separate from the second power supply, and the second power supply can be dedicated to provide power to the second anode and the second cathode separate from the first power supply. Unlike conventional systems that have a single power supply that provides power to the electrodes in all of the processing stations in a tool using cables of different lengths (and thus impedances), a further aspect of several of these embodiments is that the first power supply can be electrically coupled to the first processing chamber with a conductive link having a first impedance, and the second power supply can be electrically coupled to the second processing chamber with a conductive link having a second impedance at least approximately the same as the first impedance. For example, the first and second conductive links can have approximately the same lengths and/or approximately the same resistances because the first and second power supplies can be located approximately the same distances from the first and second processing stations, respectively. This accordingly is expected to reduce the need to compensate for differences in the signals caused by the links. In a further aspect of the invention, the first and second power supplies can each include an input portion configured to receive electrical power and an output portion configured to transmit electrical power. The output portion of each of the first and second power supplies can be electrically decoupled from all other processing chambers of the housing.

In yet a further aspect of an embodiment of the invention, the first and second power supplies are separated from each other so that the first and second conductive links to the power supplies extend through separate raceways. This feature reduces the number of cables in close proximity to each other, which is expected to reduce inductive and capacitive coupling.

The invention is also directed toward a method for assembling a tool for processing a microelectronic workpiece. In one aspect of the invention, the method can include positioning a first processing chamber in a housing, with the first processing chamber having a first anode and a first cathode and being configured to process a microelectronic workpiece. The method can further include positioning a second processing chamber in the housing, with the second processing chamber having a second anode and a second cathode and being configured to process a microelectronic workpiece. The method can still further include coupling a first output portion of a first power supply to at least one of the first anode and the first cathode, with the first output portion electrically decoupled from the second anode and the second cathode. The method can further include coupling a second output portion of a second power supply to at least one of the second anode and the second cathode, with the second output portion electrically decoupled from the first anode and the first cathode.

The invention is also directed toward a method for processing microelectronic workpieces. In one aspect of the invention, the method can include positioning a first microelectronic workpiece in a first processing chamber located within a housing defining a processing environment, and positioning a second microelectronic workpiece in a second processing chamber located within the housing. The method can further include providing power to at least one of a first anode and first cathode of the first processing chamber from a first output portion of a first power supply, and providing power to at least one of a second anode and a second cathode of the second processing chamber from a second output portion of a second power supply different than the first power supply. The power provided by the first power supply and the second power supply can be provided with the second output portion electrically decoupled from the first anode and the first cathode, and the first output portion electrically decoupled from the second anode and the second cathode.

DETAILED DESCRIPTION

The following disclosure describes methods and apparatuses for distributing power to components of a tool for processing microelectronic workpieces. The term "microelectronic workpiece" is used throughout to include a workpiece formed from a substrate upon which and/or in which microelectronic circuits or components, data storage elements or layers, and/or micro-mechanical elements are fabricated. Many specific details of certain embodiments of the invention are set forth in the following description and in FIGS. 2–4 to provide a thorough understanding of these embodiments. One skilled in the art, however, will understand that the present invention may have additional embodiments, and that the invention may be practiced without several of the details described below.

Figure 2:
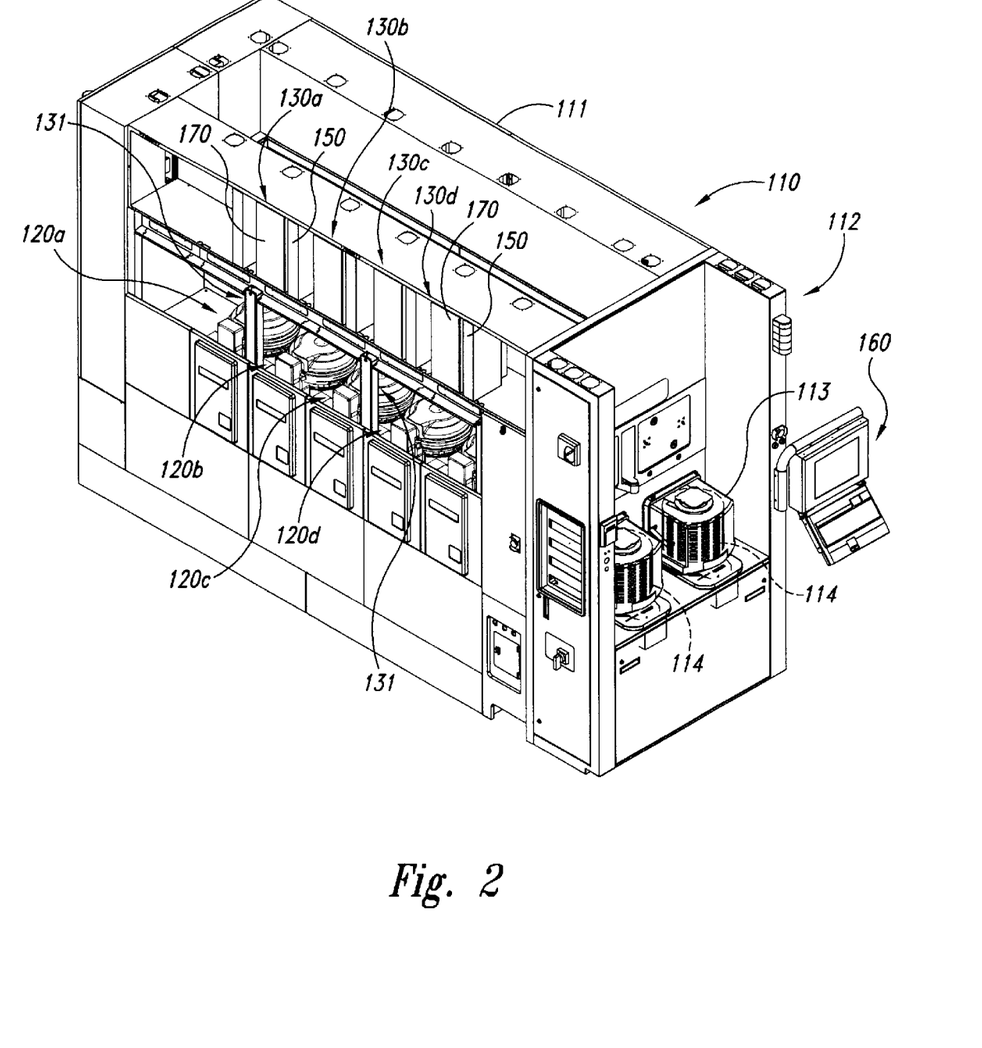
FIG. 2 is an isometric view of an apparatus in accordance with an embodiment of the invention showing selected components schematically.

FIG. 2 illustrates an apparatus 110 in accordance with an embodiment of the invention. In one aspect of this embodiment, the apparatus 110 can include a housing 111 that defines a controlled clean room environment. The housing 111 can include a plurality of processing chambers 120 (four are shown in FIG. 2 as processing chambers 120a–d), each of which can be configured to perform one or more processes on one or more microelectronic workpieces 114. The workpieces 114 are initially positioned in containers 113, which are maneuvered into position, opened, and accessed at a workpiece loader 112. A robot (not shown in FIG. 2) removes the workpieces 114 from the containers 113, distributes the workpieces 114 to the appropriate processing chambers 120 for processing, and returns the processed workpieces 114 to the container 113. The workpiece loader 112 can include a device generally similar to that disclosed in the U.S. Application entitled "Transfer Devices for Handling Microelectronic Workpieces Within an Environment of a Processing Machine and Methods of Manufacturing and Using Such Devices in the Processing of Microelectronic Workpieces" (Perkins Coie Docket No. 291958153US) filed concurrently, which has been incorporated by reference above. The robot can include a device generally similar to that disclosed in the U.S. Application entitled "Method and Apparatus for Accessing Microelectronic Workpiece Containers" (Perkins Coie Docket No. 291958103US) filed concurrently, which has been incorporated by reference above.

In one aspect of the embodiment shown in FIG. 2, the apparatus 110 can include separate power supplies 130 (shown in FIG. 2 as power supplies 130a–d). Each power supply 130 can be dedicated to provide power to the electrodes of a single processing chamber 120. Accordingly, each power supply 130 generally has a power conditioning module 170 (e.g., a rectifier/voltage regulator) at the front end to condition incoming power to a state suitable for use with the electrodes. In an alternate embodiment, each power supply 130 could be coupled to a valve control module 150 to provide power to control devices of the processing chambers 120. The apparatus 110 can further include one or more protective conductor enclosures 131 that carry cables and/or other conductive links between the power supplies 130 and the processing chambers 120. The operation of the power supplies 130 can be controlled by a microprocessor such as a system coordination computer 160 under the direction of a user. Further details of the operation of the power supplies 130 are described below with reference to the FIGS. 3 and 4.

Figure 3:
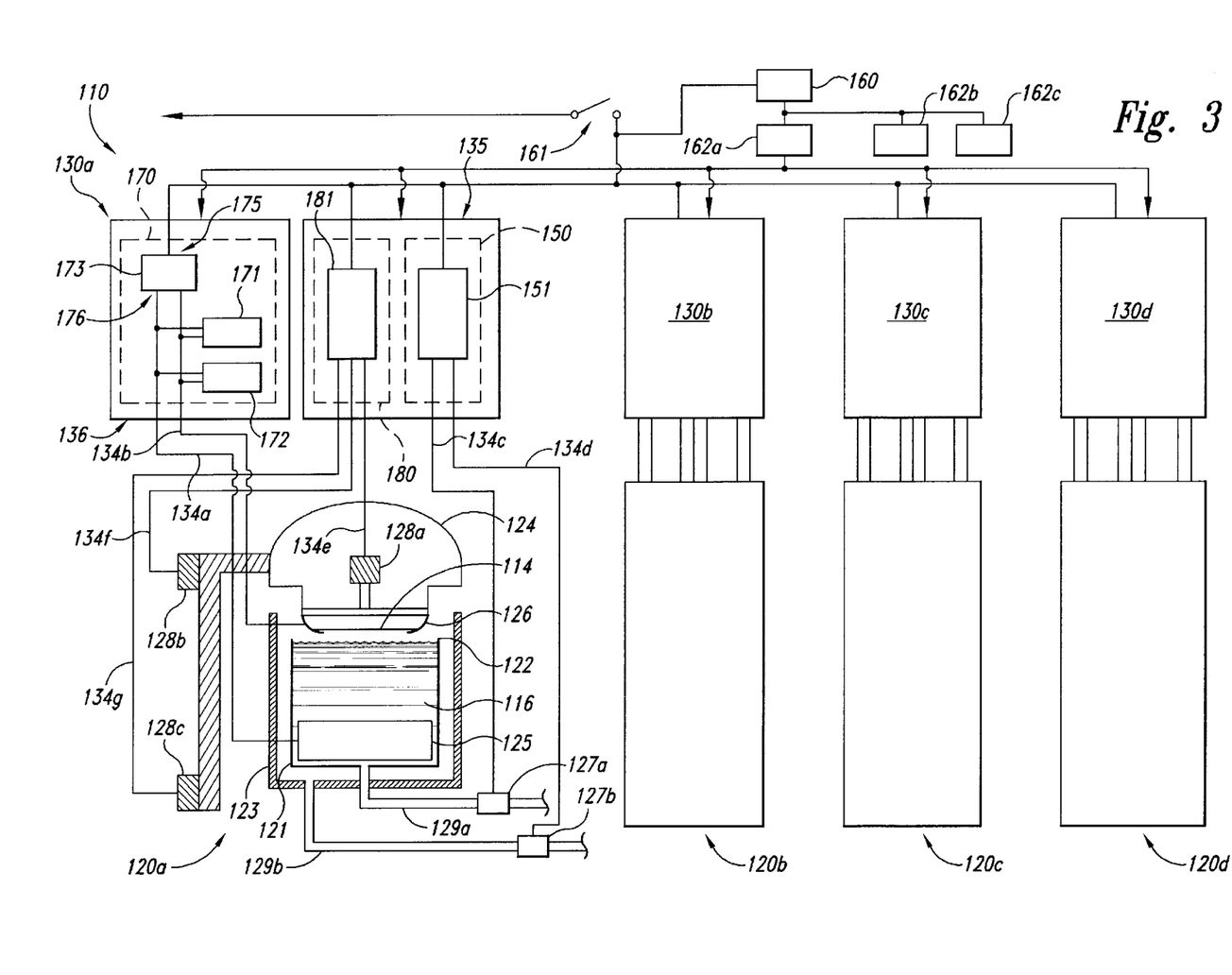
FIG. 3 is a block diagram illustrating components of an apparatus in accordance with an embodiment of the invention showing selected components schematically.

FIG. 3 illustrates a block diagram of many of the components of the apparatus 110 described above with reference to FIG. 2. In one embodiment, the apparatus 110 can include the four processing chambers 120a–d, each coupled to a corresponding dedicated power supply 130a–d, as described above. For purposes of illustration, power supply 130a and processing chamber 120a are shown in greater detail than the remaining power supplies 130b–d and processing chambers 120b–d. In other embodiments, the apparatus 110 can have more or fewer processing chambers 120 coupled to dedicated power supplies 130. In any of these embodiments, the power provided to one processing chamber 120 can be decoupled from the power provided to some or all of the other processing chambers 120. As a result, communication between the power supplies 130 and the processing chambers 120 can be more consistent from one processing chamber 120 to the next, as described below.

In one embodiment, the processing chambers 120 can include electroplating chambers configured to plate conductive layers such as metal layers on the microelectronic workpieces 114. For example, the processing chamber 120 can include features generally similar to those described in U.S. Pat. Nos. 6,228,232; 6,080,291; U.S. application Ser. No. 09/804,696, filed Mar. 12, 2001; and/or U.S. application Ser. No. 09/804,697, filed Mar. 12, 2001, all of which are incorporated herein in their entireties by reference. Accordingly, each processing chamber 120 can include a cup 121 that supports a first electrode, such as an anode 125. The cup 121 receives processing fluid 116 through a supply line 129a that is regulated by a supply valve 127a. The processing fluid 116 can fill the cup 121 and spill over a weir 122 into an overflow vessel 123. Accordingly, the weir 122 can define the level of the processing fluid 116 in the cup 121. The processing fluid 116 can exit the processing chamber 120 through an exit line 129b that is regulated by an exit valve 127b.

The processing chamber 120 can further include a head 124 or other support member that supports a microelectronic workpiece 114 in contact with the processing fluid 116. A second electrode, such as a cathode 126, is positioned in the head 124 to apply an electrical potential to the microelectronic workpiece 114. The head 124 can include a spin motor 128a that spins the microelectronic workpiece 114 and the cathode 126 as the microelectronic workpiece 114 contacts the processing fluid. By applying a different potential to the anode than the cathode, the user can controllably apply conductive ions in the processing fluid 116 to the surface of the workpiece 114 (or, alternatively, remove conductive material from the workpiece 114). It will be appreciated that the first and second electrodes can carry either a cathodic or an anodic charge for either depositing or removing material from the workpiece according to the particular materials that are used in the processing chamber.

The head 124 can be coupled to a lift motor 128c that lowers the head 124 and the microelectronic workpiece 114 into contact with the processing fluid 116 in the cup 121. The head 124 can also include a rotate motor 128b that rotates the head 124 to an inverted position for placing the microelectronic workpiece 114 in contact with the cathode 126 prior to processing, and removing the microelectronic workpiece 114 from the cathode 126 after processing.

The processing chambers 120a–d and the system coordination computer 160 are generally powered by other power supplies separate from the power supply 130. Accordingly, the apparatus 110 can include a power switch 161 coupleable to a source of power, such as a standard 110–220 volt AC power source. The incoming power can be provided directly to the system coordination computer 160 and the power supplies 130a–d. Alternatively, the system coordination computer 160 can receive power from one of the power supplies 130, but this is not customary. In either embodiment, the system coordination computer 160 can be operatively coupled to each of the power supplies 130a–d to control some or all aspects of the operation of each power supply 130. For example, the system coordination computer 160 can send control signals to a module computer 162a that in turn sends control signals to the power supplies 130. The system coordination computer 160 can also be coupled to other module computers (such as module computers 160b and 160c) to control other aspects of the operation of the apparatus 110.

Each power supply 130 can be configured to step down, rectify, and control the power received from the high-voltage power source. In one embodiment, the power supply 130 can correspond generally to a device available from Dynatronix, Inc. of Amery, Wis. In other embodiments, the power supply 130 can include other devices. In any of the foregoing embodiments, the power supply 130 can include an input portion 135 that receives the high-voltage power from the AC power source, and an output portion 136 that delivers controlled low-voltage current to the processing chambers 120. The input portion 135 and the output portion 136 can include terminals or other conventional electrical couplings. The input portion 135 can be coupled to a transformer 173 having an input side 175 for receiving high-voltage AC current, and an output side 176 for providing rectified low-voltage DC current. For example, the transformer 173 can provide DC current at 48 volts in one embodiment or other voltages in alternate embodiments. In any of the foregoing embodiments, the output side 176 of the transformer 173 can be coupled to a storage device 172, for example a capacitor bank, to store up charge for delivering electrical pulses to the anode 125 and/or the cathode 126. The transformer 173 can also be coupled to a signal conditioner 171 that can control aspects of the signals delivered to the anode 125 and/or the cathode 126. For example, the signal conditioner 171 can control characteristics such as duration, spacing, and amplitude of the electrical pulses delivered to the anode 125 and/or the cathode 126.

Another power source separate from the power supply 130 is generally coupled to a valve controller 151 to control the operation of the valves 127 of the processing chamber 120. The valve controller 151 can be positioned in the valve control module 150. In one aspect of this embodiment, the valve control module 150 can have a standalone housing. Alternatively, the valve control module 150 and/or the valve controller 151 can be located in the same housing as the transformer 173, the storage device 171 and the signal conditioner 172. In either embodiment, the valve controller 151 can control the operation of electrically powered valves, such as the supply valve 127a, the exit valve 127b or other valves of the apparatus 110.

A power source separate from the power supply 130 is also generally coupled to a motor controller 181 to control the motors 128a, 128b and 128c of the processing chambers 120. In one aspect of this embodiment, the motor controller 181 can be housed in the power conditioning module 170 or the valve control module 150. Alternatively, the motor controller 181 can be housed in a separate motor control module 180.

In the particular embodiment shown in FIG. 3, the output portions 136 of the power supplies 130 are generally coupled only to the electrodes in corresponding processing chambers 120 with conductive links 134 (shown individually in FIG. 3 as conductive links 134a–b), such as electrical cables. Conductive links 134a and 134b can be coupled to the anode 125 and the cathode 126, respectively. Accordingly, the electrodes in each of the processing chambers 120 can receive power from a single one of the power supplies 130. An advantage of this arrangement is that the apparatus 110 can be manufactured in a modular fashion, with processing chambers 120 added to or removed from the apparatus 120 during manufacture without having to alter or re-select a central power supply. A further advantage is that if a processing chamber 120 must be removed and replaced in the field, this operation can be completed without having to alter or replace a central power supply.

The other electrical components of the processing chambers 120 can be coupled to power sources other than the power supplies 130 by links 134c–134g. As shown in FIG. 3, the valve control module 150 and the motor control module 180 are powered by line power. As such, the conditioned power provided by the power supplies 130a–d is typically used only for the electrodes in the processing chambers 120 in many embodiments of the invention.

In one aspect of this embodiment, the conductive links 134 can be selected to improve the uniformity of the signals provided to each of the chambers 120a–d independently of whether or not each processing chamber 120 is coupled to a dedicated power supply 130. For example, when the conductive links are coupled to identical or generally similar components of different processing chambers 120, then the electrical properties of these links can be at least approximately identical. Accordingly, each of the conductive links 134a provided to the anodes 125 of each chamber can have at least approximately the same length, and each of the conductive links 134b provided to the cathodes 126 can also have approximately the same length.

In a further aspect of this embodiment, each of the conductive links 134a and 134b can have the same impedance and/or the same resistance for each of the chambers 120a–d. An advantage of this feature is that the signals provided to the anodes 125 and cathodes 126 in each of the chambers 120a–d can be more uniform. For example, by providing cables 134a–b having at least approximately identical lengths for the processing chambers 120a–d, the impedances and/or resistances for the cable are at least substantially the same for each chamber 120 such that the signals applied to the anodes 125 and the cathodes 126 can be more consistent from chamber to chamber, resulting in more uniformly processed microelectronic workpieces 114.

In other embodiments, the conductive links 134 can have other arrangements for at least approximately matching the impedances of conductive paths to similar components of different chambers 120. For example, the conductive links 134 can have different lengths, but can include a resistor or a resistor in parallel with a capacitor to match the resistance or impedance of other conductive links 134 connected to similar components.

Another feature of an embodiment of the arrangement described above with reference to FIGS. 2 and 3 is that each power supply 130 can be positioned close to its corresponding processing chamber 120. Accordingly, the length of the conductive links 134 between the power supply 130 and the processing chamber 120 can be less than for some conventional arrangements. An advantage of this feature is that the resistance of the conductive links will be less likely to affect the strength of the signals carried over the conductive links 134. A further advantage is that the shorter conductive links 134 will be less likely to be affected by signals from other conductors within the apparatus 110 to inhibit inductive or capacitive coupling.

In other embodiments, other conductive links 134 can also be selected to have similar or identical properties. For example, when other electrically operated devices of the processing chambers 120a require or benefit from more consistent signals, these devices can be coupled to conductive links having uniform conductive properties. These conductive links can be applied to the processing chambers 120 when the processing chambers include electroplating vessels (as shown in FIG. 3) or, alternatively, when the processing chambers include other devices, such as annealing chambers, cleaning chambers, metrology chambers, or chambers configured to carry out other processes on the microelectronic workpieces 114.

Figure 4:
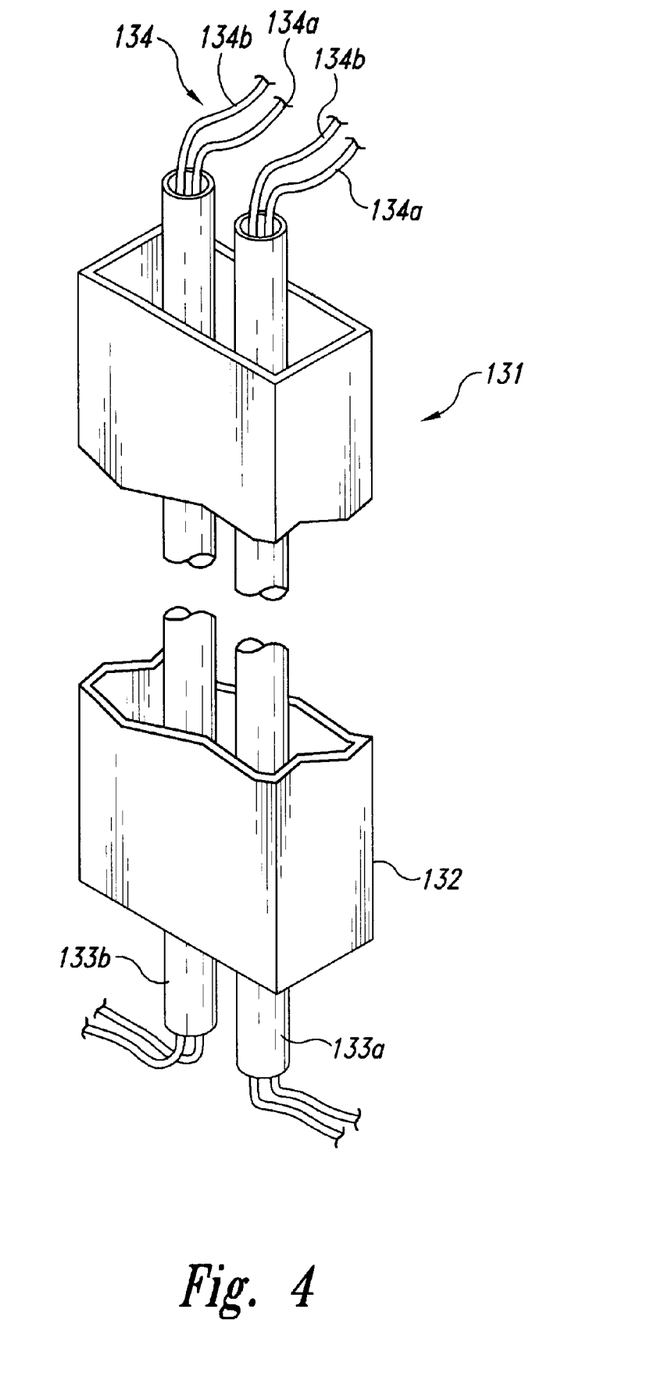
FIG. 4 is an isometric view of a conductor enclosure in accordance with an embodiment of the invention.

FIG. 4 illustrates a protective conductor enclosure 131 configured to route conductive links 134 in accordance with an embodiment of the invention. In one aspect of this embodiment, the conductor enclosure 131 can include a raceway 132 configured to carry conductive links 134 from two power supplies 130 (FIG. 2) to two corresponding processing chambers 120 (FIG. 2). In a further aspect of this embodiment, the raceway 132 can include two conduits 133a and 133b, each of which carries two conductive links 134a and 134b for coupling to the anode 125 (FIG. 3) and the cathode 126 (FIG. 3) of the processing chamber 120

(FIG. 3). Each conductive link 134a and 134b can include a shielded cable. Accordingly, the conductor enclosure 131 can protect and route the conductive links 134, and the conduits 133a and 133b can shield the conductive links coupled to one processing chamber 120 from signals transmitted along the conductive links coupled to a neighboring processing chamber 120. An advantage of this arrangement is that signals communicated along one set of conductive links 134a and 134b can be less likely to influence or interfere with signals conducted along the conductive links 134a and 134b of a neighboring processing chamber 120.

From the foregoing, it will be appreciated that specific embodiments of the invention have been described herein for purposes of illustration, but various modifications may be made without deviating from the spirit and scope of the invention. For example, in one embodiment, a single power supply 130 can provide power to electrodes in multiple processing chambers 120 while still providing advantages such as matched conductive link impedances and/or lengths. Accordingly, the invention is not limited except as by the appended claims.

What is claimed is:

1. An apparatus for processing microelectronic workpieces, comprising:
   a housing at least partially enclosing a process environment;
   a first processing chamber within the housing, the first processing chamber having a first anode and a first cathode;
   a second processing chamber within the housing, the second processing chamber having a second anode and a second cathode;
   a first power supply located a first distance from the first processing chamber and electrically coupled to the first processing chamber to provide electrical power to at least one of the first anode and the first cathode; and
   a second power supply located a second distance from the second processing chamber and electrically coupled to the second processing chamber to provide electrical power to at least one of the second anode and the second cathode, wherein the first distance is at least approximately the same as the second distance.

2. The apparatus of claim 1 wherein the first power supply includes a first input portion configured to receive electrical power and a first output portion configured to transmit electrical power, and wherein the second power supply includes a second input portion configured to receive electrical power and a second output portion configured to transmit electrical power, and wherein the first output portion is electrically decoupled from the second output portion.

3. The apparatus of claim 1 wherein:
   the first processing chamber includes a first electroplating vessel and at least one first fluid control valve positioned to control a flow of fluid into and/or out of the first electroplating vessel; and wherein
   the second processing chamber includes a second electroplating vessel and at least one second fluid control valve positioned to control a flow of fluid into and/or out of the second electroplating vessel; further wherein
   the first power supply includes a first transformer configured to step electrical current down from a first potential to a second potential, the first power supply being electrically coupled to the first anode and the first cathode; still further wherein
   the second power supply includes a second transformer configured to step electrical current down from the first potential to the second potential, the second power supply being electrically coupled to the second anode and the second cathode.

4. The apparatus of claim 1, further comprising:
   a first protective enclosure positioned between the first power supply and the first processing chamber;
   a first electrical conductor disposed in the first enclosure and connected between the first power supply and the first processing chamber;
   a second protective enclosure positioned between the second power supply and the second processing chamber; and
   a second electrical conductor disposed in the second enclosure and coupled between the second power supply and the second processing chamber.

5. The apparatus of claim 1, further comprising:
   a protective raceway positioned between the power supplies and the processing chambers;
   first and second conduits positioned within the protective raceway;
   a first electrical conductor disposed in the first conduit and connected between the first power supply and the first processing chamber; and
   a second electrical conductor disposed in the second conduit and coupled between the second power supply and the second processing chamber.

6. The apparatus of claim 1, further comprising:
   a first electrical conductor coupled between the first power supply and the first processing chamber, the first electrical conductor having a first length; and
   a second electrical conductor coupled between the second power supply and the second processing chamber, the second electrical conductor having a second length at least approximately the same as the first length.

7. The apparatus of claim 1 wherein the first processing chamber includes a vessel and an electrically operated valve in fluid communication with the vessel to control a flow of processing fluid into or out of the vessel, and wherein a separate power supply is electrically coupled to the valve.

8. The apparatus of claim 1 wherein the first power supply includes a first step-down transformer having an input side coupleable to a source of electrical power and an output side coupled to the first processing chamber, and wherein the second power supply includes a second step-down transformer having an input side coupleable to the source of electrical power and an output side coupled to the second processing chamber, still further wherein the output side of the first step-down transformer is electrically isolated from the output side of the second step-down transformer.

9. An apparatus for processing microelectronic workpieces, comprising:
   a housing at least partially enclosing a process environment;
   a first processing chamber within the housing, the first processing chamber having at least one first electrically powered device;
   a second processing chamber within the housing, the second processing chamber having at least one second electrically powered device;
   a first power supply electrically coupled to the first processing chamber to provide electrical power to the at least one first electrically powered device, the first power supply having an input portion configured to receive electrical power and an output portion configured to transmit electrical power, the output portion being electrically decoupled from all other processing chambers of the housing; and a second power supply electrically coupled to the second processing chamber to provide electrical power to the at least one second electrically powered device, the second power supply having an input portion configured to receive electrical power and an output portion to transmit electrical power, the output portion of the second power supply being electrically decoupled from all other processing chambers of the housing.

10. The apparatus of claim 9 wherein:

the first processing chamber includes a first electroplating vessel having a first anode and a first cathode; and wherein the second processing chamber includes a second electroplating vessel having a second anode and a second cathode; further wherein the first power supply includes a first transformer configured to step electrical current down from a first potential to a second potential, the first power supply being electrically coupled to the first anode and the first cathode; still further wherein the second power supply includes a second transformer configured to step electrical current down from the first potential to the second potential, the second power supply being electrically coupled to the second anode and the second cathode.

11. The apparatus of claim 9, further comprising:

a first electrical conductor coupled between the first power supply and the first processing chamber, the first electrical conductor having a first length; and a second electrical conductor coupled between the second power supply and the second processing chamber, the second electrical conductor having a second length at least approximately the same as the first length.

12. The apparatus of claim 9, further comprising:

a power switch coupleable to a source of electrical power;

a first electrical connection between the power switch and the first power supply; and a second electrical connection between the power switch and the second power supply.

13. The apparatus of claim 9, further comprising:

a first protective enclosure positioned between the first power supply and the first processing chamber;

a first electrical conductor disposed in the first enclosure and connected between the first power supply and the first processing chamber;

a second protective enclosure positioned between the second power supply and the second processing chamber; and a second electrical conductor disposed in the second enclosure and coupled between the second power supply and the second processing chamber.

14. The apparatus of claim 9, further comprising:

a raceway positioned between the power supplies and the processing chambers;

first and second conduits positioned within the raceway;

a first electrical conductor disposed in the first conduit and connected between the first power supply and the first processing chamber; and a second electrical conductor disposed in the second conduit and coupled between the second power supply and the second processing chamber.

15. The apparatus of claim 9 wherein the first processing chamber includes an anode and the first power supply is electrically coupled to the anode.

16. The apparatus of claim 9 wherein the first processing chamber includes a cathode and the first power supply is electrically coupled to the cathode.

17. The apparatus of claim 9 wherein the first power supply includes a first step-down transformer having an input side coupleable to a source of electrical power and an output side coupled to the first processing chamber, and wherein the second power supply includes a second step-down transformer having an input side coupleable to the source of electrical power and an output side coupled to the second processing chamber.

18. The apparatus of claim 9 wherein:

the first processing chamber includes a first plating chamber having a first fluid vessel disposed within a first overflow vessel, a first anode disposed within the first fluid vessel, and a first cathode positioned proximate to the first fluid vessel and configured to be electrically coupled to a microelectronic workpiece, at least one of the first anode and the first cathode being coupled to the first power supply; and wherein the second processing chamber includes a second plating chamber having a second fluid vessel disposed within a second overflow vessel, a second anode disposed within the second fluid vessel, and a second cathode positioned proximate to the second fluid vessel and configured to be electrically coupled to a microelectronic workpiece, at least one of the second anode and the second cathode being coupled to the second power supply.

19. An apparatus for processing microelectronic workpieces, comprising:

a housing at least partially enclosing a process environment;

a first processing chamber within the housing, the first processing chamber having at least one first electrically powered device;

a second processing chamber within the housing, the second processing chamber having at least one second electrically powered device;

a first power supply;

a second power supply;

a first electrical link coupled between the first power supply and the first processing chamber to transmit electrical power from the first power supply to the at least one first electrically powered device, the first electrical link having a first impedance; and a second electrical link coupled between the second power supply and the second processing chamber to transmit electrical power from the second power supply to the at least one second electrically powered device, the second electrical link having a second impedance at least approximately identical to the first impedance.

20. The apparatus of claim 19 wherein the first power supply includes an input portion configured to receive electrical power and an output portion coupled to the first electrical link, and wherein the second power supply includes an input portion configured to receive electrical power and an output portion coupled to the second electrical link, still further wherein the output portion of the first power supply is electrically decoupled from the output portion of the second power supply.

21. The apparatus of claim 19 wherein the first electrically powered device includes at least one of a first anode and a first cathode, and wherein the second electrically powered device includes at least one of a second anode and a second cathode, and wherein the first electrical link includes a first cable having a first length and a first resistance, further wherein the second electrical link includes a second cable having a second length approximately the same as the first length and a second resistance approximately the same as the first resistance.

22. The apparatus of claim 19 wherein:
the first processing chamber includes a first electroplating vessel having a first anode and a first cathode; and wherein
the second processing chamber includes a second electroplating vessel having a second anode and a second cathode; further wherein
the first power supply includes a first transformer configured to step electrical current down from a first potential to a second potential, the first power supply being electrically coupled to the first anode and the first cathode; still further wherein
the second power supply includes a second transformer configured to step electrical current down from the first potential to the second potential, the second power supply being electrically coupled to the second anode and the second cathode.

23. The apparatus of claim 19, further comprising:
a first protective enclosure positioned between the first power supply and the first processing chamber, the first protective enclosure being disposed around the first electrical link; and
a second protective enclosure positioned between the second power supply and the second processing chamber, the second protective enclosure being disposed around the second electrical link.

24. The apparatus of claim 19, further comprising:
a raceway positioned between the power supplies and the processing chambers; and
first and second conduits positioned within the raceway, with the first electrical link disposed within the first conduit and the second electrical link disposed within the second conduit.

25. The apparatus of claim 19 wherein the first processing chamber includes an anode and the first power supply is electrically coupled to the anode.

26. The apparatus of claim 19 wherein the first processing chamber includes a cathode and the first power supply is electrically coupled to the cathode.

27. The apparatus of claim 19 wherein the first power supply includes a first step-down transformer having an input side coupleable to a source of electrical power and an output side coupled to the first processing chamber, and wherein the second power supply includes a second step-down transformer having an input side coupleable to the source of electrical power and an output side coupled to the second processing chamber.

28. The apparatus of claim 19 wherein:
the first processing chamber includes a first plating chamber having a first fluid vessel disposed within a first overflow vessel, a first anode disposed within the first fluid vessel, and a first cathode positioned proximate to the first fluid vessel and configured to be electrically coupled to a microelectronic workpiece, at least one of the first anode and the first cathode being coupled to the first power supply; and wherein
the second processing chamber includes a second plating chamber having a second fluid vessel disposed within a second overflow vessel, a second anode disposed within the second fluid vessel, and a second cathode positioned proximate to the second fluid vessel and configured to be electrically coupled to a microelectronic workpiece, at least one of the second anode and the second cathode being coupled to the second power supply.

29. An apparatus for processing microelectronic workpieces, comprising:
a housing at least partially enclosing a process environment;
a first processing chamber within the housing, the first processing chamber having a first vessel configured to contain a processing liquid, a first anode disposed in the first vessel, and a first cathode configured to be electrically coupled to a microelectronic workpiece;
a second processing chamber within the housing, the second processing chamber having a second vessel configured to contain a processing liquid, a second anode disposed in the second vessel, and a second cathode configured to be electrically coupled to a microelectronic workpiece;
a first power supply electrically coupled to at least one of the first anode and the first cathode with a first electrical link having a first length; and
a second power supply electrically coupled to at least one of the second anode and the second cathode with a second electrical link having a second length at least approximately identical to the first length.

30. The apparatus of claim 29, further comprising:
a raceway positioned between the power supplies and the processing chambers; and
first and second conduits positioned within the raceway, with the first electrical link disposed within the first conduit and the second electrical link disposed within the second conduit.

31. The apparatus of claim 29 wherein the first and second electrical links have approximately the same resistance.

32. An apparatus for processing a microelectronic substrate, comprising:
a housing at least partially enclosing a process environment;
a first electroplating chamber in the housing, the first electroplating chamber having a first processing vessel configured to contain a processing fluid, the first electroplating chamber further having at least one electrically operated valve positioned to control a flow of the processing fluid into and/or out of the first processing vessel, the first electroplating chamber still further having an anode disposed within the first processing vessel, and a cathode configured to be electrically coupled to a microelectronic workpiece;
a first power supply having an input portion configured to receive electrical power and an output portion electrically coupled to the anode and the cathode;
a second electroplating chamber in the housing, the second electroplating chamber having a second processing vessel configured to contain a processing fluid, the second electroplating chamber further having at least one electrically operated valve positioned to control a flow of the processing fluid into and/or out of the second processing vessel, the second electroplating chamber still further having an anode disposed within the second processing vessel, and a cathode configured to be electrically coupled to a microelectronic workpiece; and a second power supply having an input portion configured to receive electrical power and an output portion electrically coupled to the anode and the cathode, wherein the output portion of the second power supply is electrically isolated from the anode, the cathode and the at least one valve of the first electroplating chamber, and the output portion of the first power supply is electrically isolated from the anode, the cathode and the at least one valve of the second electroplating chamber.

33. The apparatus of claim 32, further comprising:
a first conductive link between the first power supply and the first anode, the first conductive link having a first resistance; and
a second conductive link between the second power supply and the second anode, the second conductive link having a second resistance at least approximately the same as the first resistance.

34. The apparatus of claim 32, further comprising:
a first conductive link between the first power supply and the first cathode, the first conductive link having a first resistance; and
a second conductive link between the second power supply and the second cathode, the second conductive link having a second resistance at least approximately the same as the first resistance.

35. The apparatus of claim 32, further comprising:
a first electrical cable coupled between the first power supply and the first anode, the first electrical cable having a first length; and
a second electrical cable coupled between the second power supply and the second anode, the second electrical cable having a second length at least approximately the same as the first length.

36. The apparatus of claim 32, further comprising:
a first electrical cable coupled between the first power supply and the first cathode, the first electrical cable having a first length; and
a second electrical cable coupled between the second power supply and the second cathode, the second electrical cable having a second length at least approximately the same as the first length.

37. An apparatus for processing microelectronic workpieces, comprising:
a processing chamber having a vessel configured to hold a processing fluid;
a first electrode disposed within the vessel;
a second electrode positioned proximate to the vessel and configured to be removably electrically coupled to a microelectronic workpiece; and
a power supply positioned proximate to the processing chamber and having an input portion configured to receive electrical power, the power supply further having an output portion electrically coupled to the first and second electrodes, the output portion being electrically decoupled from electrodes of any other processing chambers.

38. The apparatus of claim 37, further comprising:
a protective enclosure positioned between the power supply and the processing chamber; and
an electrical conductor disposed in the enclosure and connected between the power supply and the processing chamber.

39. The apparatus of claim 37, further comprising:
a raceway positioned between the power supply and the processing chamber;

a conduit positioned within the raceway; and
an electrical conductor disposed in the conduit and connected between the power supply and the processing chamber.

40. The apparatus of claim 37 wherein the power supply includes a step-down transformer having an input side coupleable to a source of electrical power and an output side coupled to the processing chamber.

41. An apparatus for processing microelectronic workpieces, comprising:
a processing chamber having a vessel configured to hold a processing fluid for electroplating a microelectronic workpiece;
an anode disposed within the vessel;
a support member configured to engage and support a microelectronic workpiece, the support member having a cathode configured to be removably electrically coupled to a microelectronic workpiece;
an electrically powered fluid control valve in fluid communication with the vessel to control a flow of fluid into and/or out of the vessel; and
a power supply positioned proximate to the processing chamber, the power supply having an input portion configured to receive electrical power and an output portion electrically coupled to at least one of the anode and the cathode, the output portion of the power supply being decoupled from anodes, cathodes and actuators of any other vessels for processing microelectronic workpieces.

42. The apparatus of claim 41, further comprising:
a protective enclosure positioned between the power supply and the processing chamber; and
an electrical conductor disposed in the enclosure and connected between the power supply and the processing chamber.

43. The apparatus of claim 41, further comprising:
a raceway positioned between the power supply and the processing chamber;
a conduit positioned within the raceway; and
an electrical conductor disposed in the conduit and connected between the power supply and the processing chamber.

44. The apparatus of claim 41 wherein the power supply includes a step-down transformer having an input side coupleable to a source of electrical power and an output side coupled to the processing chamber.

45. An apparatus for processing microelectronic workpiece, comprising:
housing means for at least partially enclosing a process environment;
first processing means for processing a microelectronic workpiece, the first processing means being positioned within the housing means and having a first anode and a first cathode;
second processing means for processing a microelectronic workpiece, the second processing means being positioned within the housing means and having a second anode and a second cathode;
first electrical power means electrically coupled to the first processing means for providing electrical power to at least one of the first cathode and the first anode; and
second electrical power means electrically coupled to the second processing means for providing electrical power to at least one of the second cathode and the second anode.

46. The apparatus of claim 45 wherein the first electrical power means includes a first input portion configured to receive electrical power, and a first output portion configured to transmit electrical power, and wherein the second electrical power means includes a second input portion configured to receive electrical power, and a second output portion configured to transmit electrical power, and wherein the first output portion is electrically decoupled from the second output portion.

47. The apparatus of claim 45, further comprising:

first conductor means for providing power to the first processing means, the first conductor means being coupled between the first electrical power means and the first processing means and having a first length; and second conductor means for providing power to the second processing means, the second conductor means being coupled between the second electrical power means and the second processing means and having a second length approximately equal to the first length.

48. The apparatus of claim 45, further comprising:

first conductor means for providing power to the first processing means, the first conductor means being coupled between the first electrical power means and the first processing means and having a first impedance; and second conductor means for providing power to the second processing means, the second conductor means being coupled between the second electrical power means and the second processing means and having a second impedance approximately equal to the first impedance.

49. An apparatus for electrochemically processing a microelectronic workpiece comprising:

a first electrochemical processing reactor including first and second electrodes disposed to electrochemically process a microelectronic workpiece at the first electrochemical processing reactor;

a second electrochemical processing reactor including first and second electrodes disposed to electrochemically process a microelectronic workpiece at the second electrochemical processing reactor;

a power supply having one or more power outputs to provide electrochemical processing power to the first and second electrode of the first electrochemical processing reactor and the first and second electrodes of the second electrochemical processing reactor; and a power distribution system connecting the one or more power outputs of the power supply to the electrodes of the first and second electrochemical processing reactors so that the characteristics of the electrochemical processing reactor is substantially the same as the characteristics of the electrochemical processing power reaching the first and second electrodes of the second electrochemical processing reactor.

50. The apparatus of claim 49 wherein the power distribution system comprises a current adjustment circuit respectively associated with each of the first and second electrochemical processing reactors.

51. The apparatus of claim 49 wherein the power distribution system comprises an impedance matching circuit respectively associated with each of the first and second electrochemical processing reactors.

52. The apparatus of claim 49 wherein the power distribution system comprises a power conditioning circuit respectively associated with each of the first and second electrochemical processing reactors.

53. An apparatus for electrochemical processing microelectronic workpieces comprising:

a first electrochemical processing reactor including first and second electrodes disposed to electrochemically process a microelectronic workpiece at the first electrochemical processing reactor;

a second electrochemical processing reactor including first and second electrodes disposed to electrochemically process a microelectronic workpiece at the second electrochemical processing reactor; and a power supply and distribution system providing electrochemical processing power to the electrodes of the first and second electrochemical processing reactors so that the characteristics of the electrochemical processing power reaching the first and second electrodes of the first electrochemical processing reactor is substantially the same as the characteristics of the electrochemical processing power reaching the first and second electrodes of the second electrochemical processing reactor.

* * * * *